(12) United States Patent
Deng

(10) Patent No.: US 7,066,026 B2
(45) Date of Patent: Jun. 27, 2006

(54) UNDERWATER ACOUSTIC VECTOR SENSOR USING TRANSVERSE-RESPONSE FREE, SHEAR MODE, PMN-PT CRYSTAL

(75) Inventor: Ken Kan Deng, Potomac, MD (US)

(73) Assignee: Wilcoxon Research, Inc., Gaithersburg, MD (US)

( * ) Notice: Subject to any disclaimer, the term of this patent is extended or adjusted under 35 U.S.C. 154(b) by 0 days.

(21) Appl. No.: 10/887,347

(22) Filed: Jul. 9, 2004

(65) Prior Publication Data

US 2005/0034519 A1    Feb. 17, 2005

Related U.S. Application Data

(60) Provisional application No. 60/486,170, filed on Jul. 11, 2003.

(51) Int. Cl.
*G01P 15/09* (2006.01)
(52) U.S. Cl. .................. 73/514.34; 310/329; 310/333; 310/360
(58) Field of Classification Search .............. 73/514.34, 73/654, 649; 310/329, 360, 333
See application file for complete search history.

(56) References Cited

U.S. PATENT DOCUMENTS

| | | | |
|---|---|---|---|
| 3,735,161 A * | 5/1973 | Perkins et al. .............. 310/329 |
| 4,928,263 A | 5/1990 | Armstrong et al. | |
| 6,038,924 A * | 3/2000 | Lee et al. ................. 73/514.34 |
| 6,209,395 B1 | 4/2001 | Kristensen | |
| 6,370,084 B1 | 4/2002 | Cray | |
| 6,697,302 B1 | 2/2004 | Cray et al. | |
| 6,715,363 B1 * | 4/2004 | Deng et al. .................... 73/782 |

OTHER PUBLICATIONS

International Search Report, Mar. 9, 2005.
Written Opinion of the International Searching Authority, Mar. 9, 2005.

* cited by examiner

*Primary Examiner*—Helen Kwok
(74) *Attorney, Agent, or Firm*—Paul Davis; Heller Ehrman LLP

(57) ABSTRACT

The present invention is directed to an acoustic vector sensor, also called particle velocity sensor. <111> direction poled, shear mode, relaxor single crystals are used as the sensing elements. In addition, these crystal plates are cut at a special orientation such that they provide zero or minimum responses in the transverse directions, but have a maximum piezoelectric response in sensing direction. The piezoelectric sensor contains a proof mass, a base, and an aforementioned relaxor crystal. Three of the sensors are mounted orthogonally with a rigid case, and they are designated to sense the acoustic particle velocity in three designated directions, say X, Y, and Z. To solve the adverse lateral constraint problem (also known as clamping effect) associated with the relaxor crystal; reduced bonding area between the proof mass and the relaxor crystal are introduced. This feature greatly reduced the percentage of the bonding area for the crystal; consequently the free-state piezoelectric properties of the relaxor crystals are preserved.

27 Claims, 1 Drawing Sheet

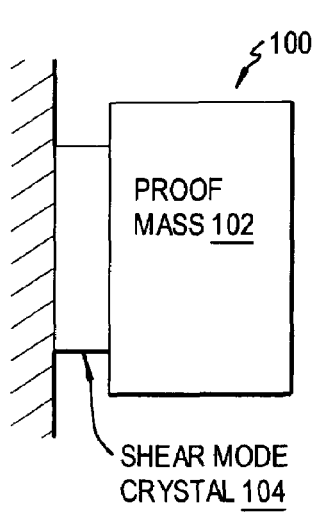
FIG. 1
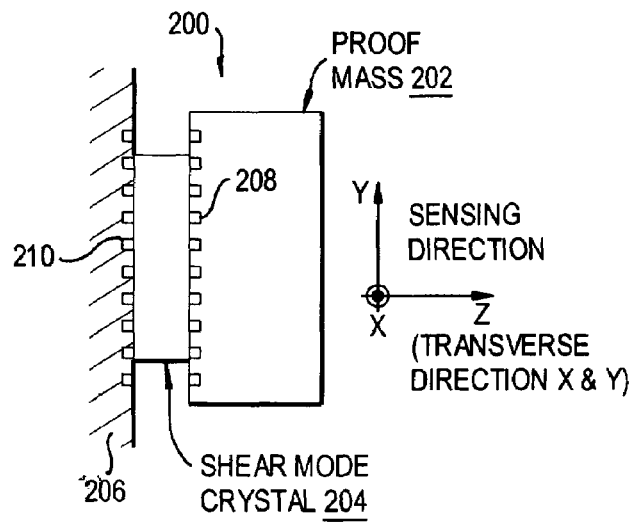
FIG. 2
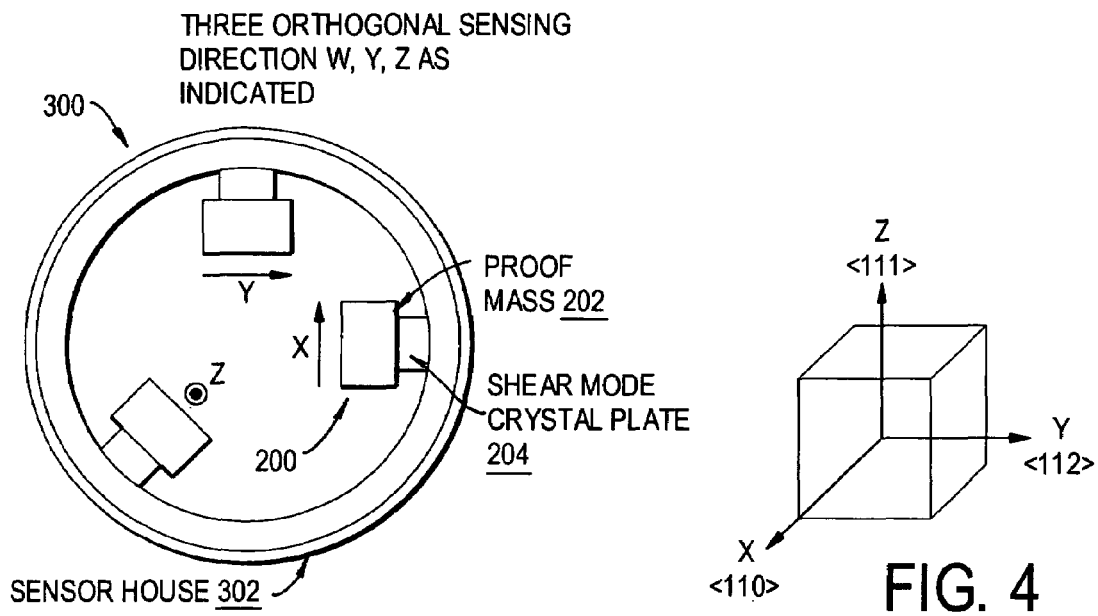
FIG. 3
FIG. 4
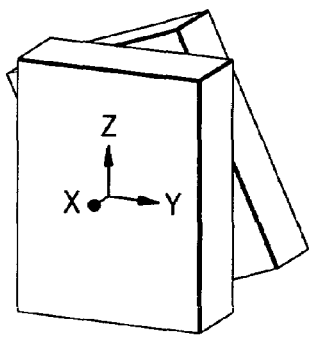
FIG. 5

UNDERWATER ACOUSTIC VECTOR SENSOR USING TRANSVERSE-RESPONSE FREE, SHEAR MODE, PMN-PT CRYSTAL

This application claims priority of provisional application Ser. No. 60/486,170 Filed Jul. 11, 2003

STATEMENT OF GOVERNMENT INTEREST

The work leading to the present invention was supported in part by Navy ONR, Contract No. N66604-03-C-1039. The United States Government has certain rights in the invention.

FIELD OF THE INVENTION

The present invention is directed to an acoustic vector sensor, specifically an underwater acoustic vector sensor.

DESCRIPTION OF RELATED ART

Inertial accelerometers have been used as the sensing elements in underwater acoustic pressure gradient (vector) sensors. Conventionally, PZT piezoelectric ceramics were used as the sensing material. Due to reduced piezoelectric properties compared to a relaxor single crystal, vector sensors using PZT resulted in low signal-to-noise ratios and narrow bandwidths.

It has recently been attempted to exploit a relaxor single crystal in a vector sensor design. Without good solutions to mitigate the adverse effects of the relaxor crystal, such as lateral constraint effect and large transverse responses, these efforts have so far ended in a vector sensor having little improvement and/or very fragile sensing structures.

U.S. Pat. No. 6,038,924 to Lee et al. discloses a seismic accelerometer comprising three piezoelectric sensing elements, with each element sensing inertial forces applied to the accelerometer from a particular direction, X, Y, or Z. Each sensing element also has a stacking construction having a base, a piezoelectric sensing element, and a mass.

U.S. Pat. No. 4,928,263 to Armstrong et al. discloses an accelerometer-based hydrophone using piezoelectric ceramic as the active material. The hydrophone comprises orthogonally arranged accelerometers that share an inertial mass and housed in a pressure vessel.

U.S. Pat. No. 6,370,084 to Cray discloses an acoustic vector sensor comprising an acoustics sensing tri-axial accelerometer, a body of syntactic foam encasing the accelerometer, a body of viscoelastic rubber encasing the body of syntactic foam, and a rigid plastic coating encasing the body of viscoelastic rubber. The viscoelastic body is acoustically transparent and isolates the accelerometer and syntactic foam sphere from the mount, and insulates the accelerometer from structure-borne flexural vibrations from supporting structures near the sensor.

U.S. Pat. No. 6,697,302 to Cray et al. discloses an underwater acoustic sensor that measures up to seven quantities of acoustic field at a collocated point. The quantities measured by the acoustic receiver sensor are acoustic pressure, three orthogonal components of acoustic particle acceleration, and three spatial gradients of the acceleration vector. These quantities are then combined to provide improved directivity of the acoustic receiver sensor.

All previous solutions suffer from high noise level and narrow frequency bandwidth.

SUMMARY OF THE INVENTION

It is therefore an object of the invention to provide a sensor having the advantages of a relaxor crystal without the disadvantages of high noise levels and narrow bandwidths. To achieve the above and other objects, the present invention uses a shear mode (d15) relaxor single crystal. Other improvements also include reduced bonding areas on the relaxor crystal to alleviate the adverse clamping effect, and a cutting orientation of the crystal given by a rotation angle around the X axis of $$\alpha = \arctan\left(\frac{d_{16}}{d_{15}}\right)$$

to eliminate the transverse piezoelectric responses.

The piezoelectric sensor of the present invention comprises a proof mass, a base, and a piezoelectric crystal sandwiched therebetween. The bonding surfaces of the proof mass and the base are preferably castellated. And the piezoelectric crystal is preferably a shear mode ($d_{15}$) relaxor single crystal.

The acoustic vector sensor of the present invention comprises three piezoelectric sensors orthogonally mounted on a rigid housing. Each of the three piezoelectric sensor measures acoustic energy from one of the three different, orthogonal, axial directions (X, Y, and Z).

BRIEF DESCRIPTION OF THE DRAWINGS

FIG. 1 shows a shear mode inertial sensor stack.

FIG. 2 shows a shear mode inertial sensor stack with castellated bonding surfaces and an optimal cut relaxor crystal plate.

FIG. 3 shows three such sensor stacks incorporated into a vector sensor.

FIG. 4 shows the coordinate system of the crystal.

FIG. 5 shows the optimal rotation of the crystal.

DETAILED DESCRIPTION OF THE PREFERRED EMBODIMENT

In an embodiment of the present invention, by utilizing a shear mode ($d_{15}$) relaxor single crystal which possesses the highest piezoelectric coefficient, coupled with the lateral constraint (clamping effect) alleviation mechanism and the identified optimal orientation of the relaxor crystal of the present invention, a vector sensor with much higher signal to noise ratio and wider frequency band can be realized.

The present invention exploits the exceptionally high piezoelectric shear coefficient ($d_{15}$) of a relaxor single crystal, and it employs unique approaches to eliminate the adverse effects, i.e. lateral constraint (clamping) effect and transverse response effect. Consequently, a miniature vector sensor with high signal-to-noise ratio and wide bandwidth is achieved.

A simple shear mode, piezoelectric, inertial stack is selected as the basic sensing element. This stack, which is shown in FIG. 1 as 100, includes a proof mass 102, a shear mode relaxor crystal plate 104 and a base 106. Two unique features are incorporated in the stack design, which are illustrated in FIG. 2, which shows a stack 200 including a proof mass 202, a shear mode relaxor crystal plate 204 and a base 206. The first feature is that the bonding surfaces 208, 210 are castellated, i.e., raised protrusions are made on the mass and base gluing surfaces. Castellated patterns can be fabricated on the bonding surface in accordance with U.S. Pat. No. 6,715,363 to Deng et al., which is incorporated herein by reference. Even though this feature resembles that of the Deng et al patent just cited, the function and characteristics are fundamentally different. The height and pattern of the protrusions are not critical, whereas the percentage of the bonding area is the most important parameter. Instead of amplifying the strain in the piezoelectric crystals, as in the Deng et al patent just cited, this feature is intended to greatly reduce the bonding area on the crystal, and doing so will effectively mitigate the lateral constraint adverse effect of the relaxor crystal. As a consequence, the piezoelectric output of the sensing structure is significantly improved. The second feature is that the relaxor shear crystal plate 204 is cut in a special orientation so that it only produces a maximum piezoelectric response in one direction (Y axis in FIG. 2) and minimum piezoelectric outputs in the other two orthogonal directions (X and Z axes in FIG. 2). The detailed information about this special orientation will be set forth below.

Three of the aforementioned stacks 200 are mounted orthogonally to each other onto a rigid housing (base) 302, which is depicted in FIG. 3, to form a vector sensor 300. Each of the stacks 200 measures acoustic energy from one of the three different, orthogonal, axial directions (X, Y, and Z). Moreover, the sensor housing 302 is preferably more rigid than the rest of the stacks 200 (or has higher resonance than that of the stacks). In an embodiment of the present invention, as shown in FIG. 3, the housing 302 can also serve as a base for the stacks 200. Alternatively, however, a separate base can be constructed for each stack and mounted onto the housing 302. The enclosed housing 302 is preferably designed to maintain approximate neutral buoyancy in water. In a preferred embodiment, the feature size of the enclosed sensor 300 is equal to or smaller than the half wavelength of the highest frequency of interest. Once submerged in water, the sensor 300 can freely float, and thereby follows the acoustical particle movement. Consequently, the pressure gradient (acceleration) of the acoustical wave can be measured by the three correspondent stacks (X, Y, Z sensing directions in FIG. 3).

The old methods employed three independent piezoelectric inertial sensors and potted them together in the material which is much lighter than water. By contrast, the current invention mounts three piezoelectric sensing structures directly on a rigid, enclosed house. The resonance of the mounting structure and housing, which are integrated as one piece, is designed to be higher than the sensing structure itself. More importantly, there are two important features that are incorporated in the shear mode sensing stack: first is the reduced bonding area through the recessed valleys and protrusions, and the second is the optimal cut crystal plate. Both these features can be employed together or independently depending on the design of the sensor.

The simple, compact sensing structure enables the most weight efficient design. The castellated bonding surfaces effectively alleviate the lateral constraint effect of relaxor crystal and still ensure a good bonding integrity. The optimal cut of the relaxor crystal plate guarantees a good sensing directivity which is crucial to a vector sensor.

The following describes the particular crystal orientation to produce a maximum piezoelectric response in one direction and minimum piezoelectric outputs in the other two orthogonal directions:

The exceptional piezoelectric property of the shear mode relaxor (PMN-PT) crystal is shown in the following Table 1:

TABLE 1

Typical Piezoelectric Properties of the Three Modes

| Material Properties | Piezoelectric Charge d Coefficients (pC/N) | | | Piezoelectric Coupling Factor | | |
|---|---|---|---|---|---|---|
| Symbol | $d_{31}$ | $d_{33}$ | $d_{15}$ | $k_{31}$ | $k_{33}$ | $k_{15}$ |
| PZT-4 | −130 | 300 | 500 | 33% | 68% | 71% |
| PMN-PT | −900 | 2000 | 4600 | 53% | 90% | 97% |

Among all of the modes, the shear mode piezoelectric coefficient $d_{15}$ has the highest value. It could benefit many sensor and actuator applications.

Table 2 below shows the piezoelectric matrix of a <111> poled PMN-PT crystal:

TABLE 2

Piezoelectric Matrix of the 3 m Crystal Class

| Output Mode | Compression Axis | | | Shear Axis | | |
|---|---|---|---|---|---|---|
| | 1(X) | 2(Y) | 3(Z) | 4(X) | 5(Y) | 6(Z) |
| 1(X) | 0 | 0 | 0 | 0 | $d_{15}$ | $-2d_{22}$ |
| 2(Y) | $-d_{22}$ | $d_{22}$ | 0 | $d_{15}$ | 0 | 0 |
| 3(Z) | $d_{31}$ | $d_{31}$ | $d_{33}$ | 0 | 0 | 0 |

Significant transverse piezoelectric effects exist in the standard cuts. The standard reference coordinates of the <111> poled relaxor crystal are shown in FIG. 4.

The transformation of the piezoelectric tensor in different orientations is as follows. The apparent piezoelectric matrix ($d_{ij}$) is actually a rank 3 tensor ($d_{imn}$), and the index transformations between them are shown in Table 3 below.

TABLE 3

Index Transformation Scheme for $d_{imn}$ and $d_{ij}$

| Tensor Index mn | 11 | 22 | 33 | 23 32 | 13 31 | 12 21 |
|---|---|---|---|---|---|---|
| Matrix Index j | 1 | 2 | 3 | 4 | 5 | 6 |

The new piezoelectric tensor after rotation is calculated by $$d'_{ijk} = a_{il} \cdot a_{jm} \cdot a_{kn} \cdot d_{lmn},$$

where:

$a_{ij}$ are the direction cosines;

index i,j,k,l,m,n=1,2,3;

$d'_{ijk}$=the piezoelectric coefficients after rotation; and $d_{lmn}$=the piezoelectric coefficients before rotation.

The optimal orientation for zero transverse piezoelectric effects is given, as shown in FIG. 5, by rotating around the X axis by an angle $$\alpha = \arctan\left(\frac{d_{16}}{d_{15}}\right).$$

The d matrix before and after that rotation will be given, where * indicate elements having non-zero values.

$$d \text{ matrix before rotation} = \begin{pmatrix} 0 & 0 & 0 & 0 & * & * \\ * & * & 0 & * & 0 & 0 \\ * & * & * & 0 & 0 & 0 \end{pmatrix}$$

$$d \text{ matrix after rotation} = \begin{pmatrix} 0 & 0 & 0 & 0 & * & 0 \\ * & * & * & * & 0 & 0 \\ * & * & * & * & 0 & 0 \end{pmatrix}$$

The concepts of the present invention have been experimentally verified using a testing structure (inertial shear stack) having the configuration shown in FIG. 1. The results are shown in Table 4 below.

TABLE 4

Test Results of the Inertial Stacks Using Conventional Cut and the New Cut PMN-PT Shear Plates

| Normalized Outputs | Piezoelectric Output | | |
|---|---|---|---|
| Along 3 Orthogonal Directions | Sensing Direction | Transverse Direction 1 | Transverse Direction 2 |
| Conventional Cut Shear Plate | 100% | 18.0% | 3.0% |
| Optimal New Cut Shear Plate | 100% | 4.5% | 3.0% |

While a preferred embodiment of the present invention has been set forth above, those skilled in the art will recognize that other embodiments can be realized within the scope of the invention, which should therefore be construed as limited only by the claims to be set forth in the non-provisional application.

What is claimed is:

1. A piezoelectric sensor comprising
   a proof mass;
   a base; and
   a piezoelectric crystal between the proof mass and the base, wherein bonding surfaces between the piezoelectric crystal and the proof mass and/or between the piezoelectric crystal and the base are castellated.

2. The sensor of claim 1, wherein the piezoelectric crystal is a shear mode ($d_{15}$) relaxor single crystal.

3. The sensor of claim 1, wherein the piezoelectric crystal is a PMN-PT crystal, poled along <111> and having a piezoelectric matrix d including coefficients $d_{15}$ and $d_{16}$, and wherein the piezoelectric crystal is rotated around its X axis by an angle $$\alpha = \arctan\left(\frac{d_{16}}{d_{15}}\right).$$

4. The sensor of claim 1, wherein the castellation comprises raised protrusions from a surface of the proof mass and/or a surface of the base that are in contact with the piezoelectric crystal.

5. An acoustic vector sensor comprising three piezoelectric sensors of claim 1.

6. The sensor of claim 5, wherein the piezoelectric crystal is a shear mode ($d_{15}$) relaxor single crystal.

7. The sensor of claim 5, wherein the piezoelectric crystal is a PMN-PT crystal, poled along <111> and having a piezoelectric matrix d including coefficients $d_{15}$ and $d_{16}$, and wherein the piezoelectric crystal is rotated around its X axis by an angle $$\alpha = \arctan\left(\frac{d_{16}}{d_{15}}\right).$$

8. The sensor of claim 5, wherein the castellation comprises raised protrusions from surfaces of the proof mass and of the base that are in contact with the piezoelectric crystal.

9. The sensor of claim 5, wherein the three piezoelectric sensors are mounted in a rigid housing.

10. The sensor of claim 9, wherein the housing is sealed and maintains neutral buoyancy in water.

11. The sensor of claim 9, wherein the housing is dimensioned to be smaller than or equal to one half wavelength of a highest frequency of interest.

12. The sensor of claim 5, wherein each of the three piezoelectric sensors senses acoustic energy from one of the three axial directions (X, Y, and Z).

13. The sensor of claim 5, wherein the three piezoelectric sensors are mounted orthogonally to each other.

14. A piezoelectric sensor comprising
   a proof mass;
   a base; and
   a piezoelectric crystal between the proof mass and the base, wherein the piezoelectric crystal is a shear mode ($d_{15}$) relaxor single crystal.

15. The sensor of claim 14, wherein the piezoelectric crystal is a PMN-PT crystal, poled along <111> and having a piezoelectric matrix d including coefficients $d_{15}$ and $d_{16}$, and wherein the piezoelectric crystal is rotated around its X axis by an angle $$\alpha = \arctan\left(\frac{d_{16}}{d_{15}}\right).$$

16. An acoustic vector sensor comprising three piezoelectric sensors of claim 14.

17. The sensor of claim 16, wherein the piezoelectric crystal is a PMN-PT crystal, poled along <111> and having a piezoelectric matrix d including coefficients $d_{15}$ and $d_{16}$, and wherein the piezoelectric crystal is rotated around its X axis by an angle $$\alpha = \arctan\left(\frac{d_{16}}{d_{15}}\right).$$

18. The sensor of claim 16, wherein the three piezoelectric sensors are mounted in a rigid housing.

19. The sensor of claim 18, wherein the housing is sealed and maintains neutral buoyancy in water.

20. The sensor of claim 18, wherein the housing is dimensioned to be smaller than or equal to one half wavelength of a highest frequency of interest.

21. The sensor of claim 16, wherein each of the three piezoelectric sensors senses acoustic energy from one of the three axial directions (X, Y, and Z).

22. The sensor of claim 16, wherein the three piezoelectric sensors are mounted orthogonally to each other.

23. An acoustic vector sensor piezoelectric sensor comprising a) a sealed and rigid housing that maintains neutral buoyancy in water; and
b) three piezoelectric sensors orthogonally mounted inside the rigid housing, wherein each of the three piezoelectric sensors contains
   i) a proof mass,
   ii) a base, and
   iii) a shear mode ($d_{15}$) relaxor single piezoelectric crystal between the proof mass and the base, wherein bonding surfaces between the piezoelectric crystal and the proof mass and/or between the crystal and the base are castellated.

24. The piezoelectric sensor comprising
a proof mass;
a base; and
a piezoelectric crystal between the proof mass and the base, wherein the piezoelectric crystal is a <111> direction poled, shear mode relaxor single crystal.

25. The sensor of claim 24, wherein the piezoelectric crystal has a piezoelectric matrix d including coefficients $d_{15}$ and $d_{16}$, and wherein the piezoelectric crystal is rotated around its X axis by an angle $$\alpha = \arctan\left(\frac{d_{16}}{d_{15}}\right).$$

26. The sensor of claim 24, wherein at least one of the proof mass and the base has raised protrusions that are in contact with the piezoelectric crystal.

27. An acoustic vector sensor comprising three piezoelectric sensors of claim 24.

* * * * *